(12) United States Patent
Hsu

(10) Patent No.: US 12,476,634 B2
(45) Date of Patent: Nov. 18, 2025

(54) ELECTRONIC CURRENT CONTROL AND MONITORING

(71) Applicant: GM Cruise Holdings LLC, San Francisco, CA (US)

(72) Inventor: Stanley Hsu, Cupertino, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 187 days.

(21) Appl. No.: 18/486,945

(22) Filed: Oct. 13, 2023

(65) Prior Publication Data

US 2025/0125800 A1    Apr. 17, 2025

(51) Int. Cl.
   *H03K 17/56*   (2006.01)
   *B60R 16/03*   (2006.01)
   *G01R 19/165*  (2006.01)

(52) U.S. Cl.
   CPC ............. *H03K 17/56* (2013.01); *B60R 16/03* (2013.01); *G01R 19/16576* (2013.01)

(58) Field of Classification Search
   CPC ... H03K 17/56; B60R 16/03; G01R 19/16576
   See application file for complete search history.

(56) References Cited

U.S. PATENT DOCUMENTS 6,329,796 B1 * 12/2001 Popescu .................... H02J 1/10
                                                   320/136
10,283,994 B2 * 5/2019 Chen ...................... H02M 3/158

* cited by examiner

*Primary Examiner* — Cassandra F Cox
(74) *Attorney, Agent, or Firm* — CANTOR COLBURN LLP

(57) ABSTRACT

Systems, methods, and apparatuses are provided for monitoring and automatically limiting an electrical current flowing to a pulsed or switching component that is voltage driven or controlled. For example, an apparatus may include a transistor electrically coupled to a power supply. In some examples, the transistor being configured to control current flow to a driver component. Additionally, the apparatus may include a resistor electrically coupled to the driver component, and a current monitor electrically coupled to a gate of the transistor and the resistor. In some examples, the current monitor may be configured to receive a threshold voltage, and receive an output voltage. Additionally, the current monitor may be configured to determine, whether the threshold voltage is greater than the output voltage, and based on the determination of whether the threshold voltage is greater than the output voltage, adjust the transistor to control the current flow to the driver component.

17 Claims, 8 Drawing Sheets

ELECTRONIC CURRENT CONTROL AND MONITORING

BACKGROUND

1. Technical Field

The present disclosure generally relates to electronic current control systems and apparatuses and, more specifically, electronic current control systems for autonomous vehicles.

2. Introduction

An autonomous vehicle is a motorized vehicle that can navigate without a human driver. An exemplary autonomous vehicle may include various pulsed or switching electronics, such as a light detection and ranging (LIDAR) sensor, an electric motor, amongst others. The pulsed or switching electronics may be voltage driven or controlled.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
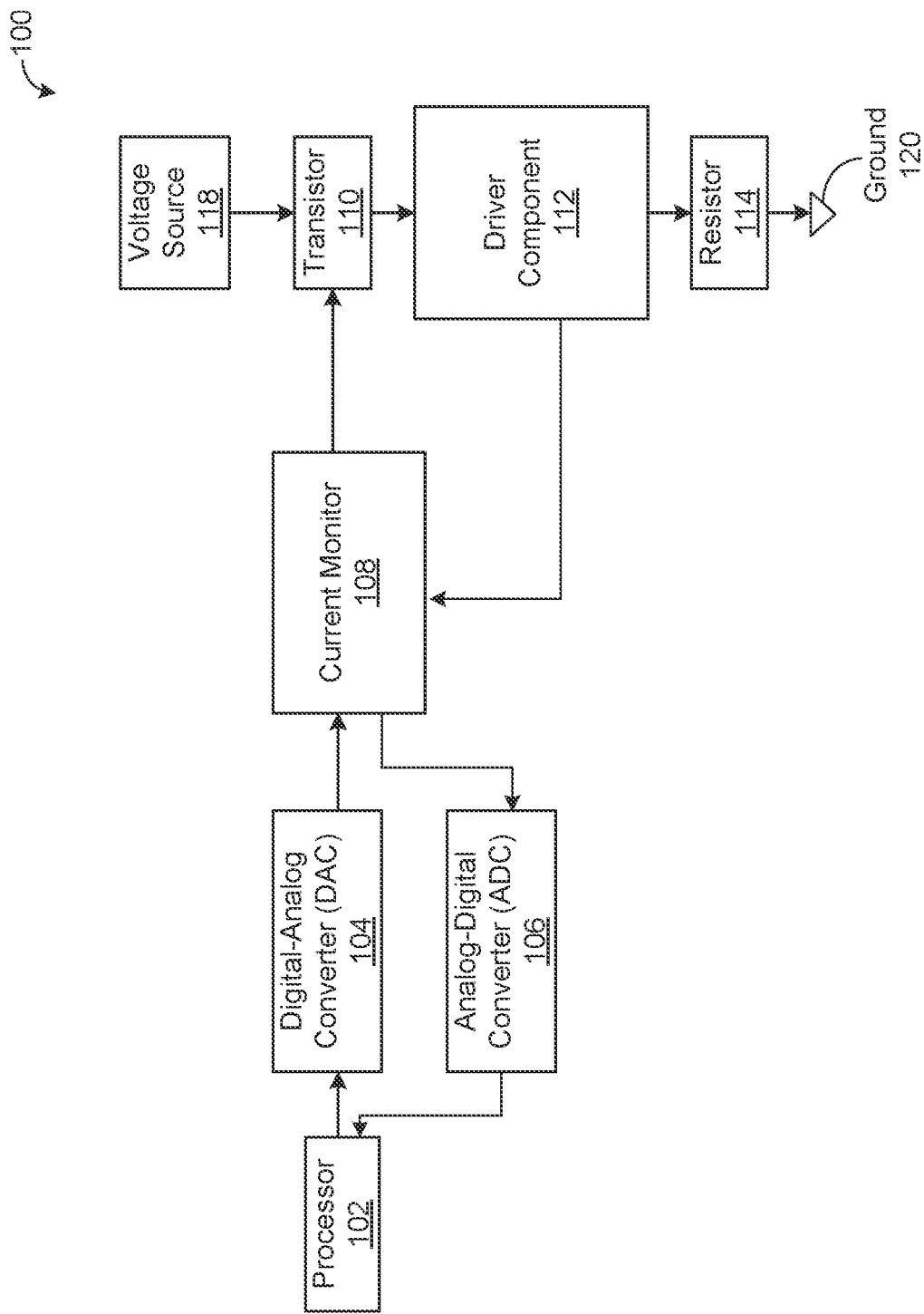
FIG. 1 illustrates an example circuit that monitors and controls an electrical current that can be provided to one or more pulsed or switching electronic components, according to some examples of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring the concepts of the subject technology.

Some aspects of the present technology may relate to the gathering and use of data available from various sources to improve safety, quality, and experience. The present disclosure contemplates that in some instances, this gathered data may include personal information. The present disclosure contemplates that the entities involved with such personal information respect and value privacy policies and practices.

In some examples, pulsed or switching electronics may be voltage driven or controlled, and as such, an electric current or current provided to the pulsed or switching electronics may not be controlled. As such, the power being applied to the pulsed or switching electronics may be too high and thus trigger unsafe thermal events (e.g., the current and power of the pulsed or switching electronics may be high enough to cause the pulsed or switching electronics to combust or burnout). In some instances, the unsafe thermal events may include a laser generated by a light detection and ranging (LIDAR) sensor being too powerful. In such instances, high levels of power being applied to the LIDAR sensor may cause the laser to be too powerful for safe public use.

In some instances, and to mitigate the uncontrolled flow of electrical current of a voltage driven pulsed or switching electronics, a processor may be utilized to control the uncontrolled flow the electrical current of the voltage driven pulsed or switching electronics. In such instances, the processor may be electrically coupled to a current control component, such as transistor, a sensing component, such as a resistor, and the pulsed or switching electronics. As described herein, the current control component may be configured to be in an open state or closed state, while the sensing component may "sense" the load current provided to the pulsed or switching electronics or output a voltage corresponding to the load current provided to the pulsed or switching electronics. Additionally, the processor may detect the voltage of the sensing component and determine the load current provided to the pulsed or switching electronics. Moreover, based on the determined load current of the pulsed or switching electronics, the processor may signal or change the state of the current control component. However, in such instances, the latencies associated with the processor determining the electrical current of the pulsed or switching electronics and the operations the processor performs to generate the signal to change or alter the state of the current control component may be too great. As such, due to said latencies, unsafe thermal events may still occur.

As described herein, a feedback loop with a current monitor component (e.g., a circuit, system, device or apparatus) may be added to the electrical pathway of the current control component, the pulsed or switching electronics and sensing component, to mitigate said latencies. As such, while the processor monitors the load current provided to the pulsed or switching electronics, the current monitor component may monitor and automatically limit the electrical current flowing to the pulsed or switching component without any user intervention or signals from the processor with much lower latencies.

FIG. 1 is a diagram illustrating an exemplary circuit diagram of circuit 100 that monitors and controls current flow provided to one or more pulsed or switching electronic components consistent with certain disclosed embodiments. As illustrated in FIG. 1, circuit 100 may include a current monitor component, such as current monitor 108, configured to monitor and automatically adjust the electrical current flowing to one or more pulsed or switching electronic components, such as driver component 112. As described herein, driver component 112 may include and drive additional components, such as one or more sensors, an optical illuminator, a pulsed electronic sensor (e.g., a light detecting and ranging (LIDAR) sensor), an actuator or a motor.

Additionally, circuit 100 may include transistor 110 coupled to power supply or voltage source 118. Moreover, current monitor 108 may be coupled to transistor 110 (e.g., a gate of transistor 110) to adjust the electrical current flowing to the one or more pulsed or switching electronic components by adjusting the state of transistor 110. As illustrated in FIG. 1, transistor 110 may be coupled to the one or more pulsed or switching electronic components via a single electrical path or voltage rail. Further, and as described herein, transistor 110 may be in an open state, or a closed state. Examples of types of a transistor that transistor 110 may be, include, but are not limited to, a negative-positive-negative bipolar (NPN) transistor. In other examples, transistor 110 may be a positive-negative-positive bipolar (PNP) transistor. In various examples, transistor 110 may be any type of semiconductor switches with a control terminal that controls the current flow between the other two terminals. In examples where the one or more pulsed or switching electronic components are voltage driven, current monitor 108 may prevent the electrical current flow of the one or more pulsed or switching electronic components from getting too high and triggering an unsafe thermal event as described herein.

In some examples, current monitor 108 may monitor current flow or a current load provided to one or more pulsed or switching electronics, such as driver component 112, based on an output voltage of a sensor resistor or resistor 114. As illustrated in FIG. 1, the sense resistor or resistor 114 may be coupled to the one or more pulsed or switching electronic components, such as driver component 112, and transistor 110 or placed in the current flow path of the one or more pulsed or switching electronic components and transistor 110, such as on a single electrical path or voltage rail. Additionally, current monitor 108 may monitor and measure the load current load or current flow provided to the one or more pulsed or switching electronic components based on an output voltage of resistor 114. Further, current monitor 108 may adjust the state of transistor 110 based on the determined or measured current flow or load current provided to the one or more pulsed or switching electronics.

In some examples, current monitor 108 may be configured to adjust transistor 110 at a particular load current or measured current flow provided to the one or more pulsed or switching electronic components. In such examples, current monitor 108 may receive a threshold voltage corresponding to a particular load current or measured current flow to adjust transistor 110 from a closed state to an open state. For example, as illustrated in FIG. 1, processor 102 may receive a user input indicating the particular load current or measured current flow. Additionally, based on the user input, processor 102 may adjust transistor 110 from a closed state to an opened state. Moreover, and as illustrated by FIG. 1, processor 102 may generate and provide a digital signal corresponding to the user input to digital-analog converter (DAC) 104. DAC 104 may, based on the digital signal, generate and provide a threshold voltage corresponding to the particular load current indicated by the user input to current monitor 108. Further, current monitor 108 may compare the output voltage of the sense resistor or resistor 114 against the threshold voltage. Based on the comparison, current monitor 108 may adjust the state of transistor 110 to control the current flow of the one or more pulsed switching electronics based on the comparison.

In some instances, processor 102 may receive the user input from a mobile computing device operated by the user. Examples of mobile computing devices that may be operated by the user include, but are not limited to a personal computer, a laptop computer, a tablet computer, a notebook computer, a hand-held computer, a personal digital assistant, a portable navigation device, a mobile phone, a smart phone, a wearable computing device (e.g., a smart watch, a wearable activity monitor, wearable smart jewelry, and glasses and other optical devices that include optical head-mounted displays (OHMDs), an embedded computing device (e.g., in communication with a smart textile or electronic fabric), and any other type of computing device that may be configured to store data and software instructions, execute software instructions to perform operations, and/or display information on an interface module, consistent with disclosed embodiments. Additionally, processor 102 may receive the user input over one or more communications networks. Examples of the one or more communications networks include, but are not limited to, a wireless local area network (LAN), e.g., a "Wi-Fi" network, a network utilizing radio-frequency (RF) communication protocols, a Near Field Communication (NFC) network, a wireless Metropolitan Area Network (MAN) connecting multiple wireless LANs, a wide area network (WAN), e.g., the Internet.

In other instances, and not illustrated in FIG. 1, processor 102 may be coupled to a display unit configured to present interface elements of a graphical user interface (GUI) to a user, and an input unit configured to receive input from the user. By way of example the display unit may include, but is not limited to, an LCD display unit or other appropriate type of display unit, and the input unit may include, but input not limited to, a keypad, keyboard, touchscreen, voice activated control technologies, or appropriate type of input unit. Further, in additional aspects (not depicted in FIG. 1), the functionalities of the display unit and the input unit may be combined into a single device, such as a pressure-sensitive touchscreen display unit that presents interface elements and receives input from the user. In such instances, the user may interact with the display unit and/or the input unit to enter a user input indicating a particular load current or measured current flow to adjust transistor 110 from a closed state to an open state. Additionally, the input unit may receive and transmit the user input to processor 102. Processor 102 may generate and provide a digital signal corresponding to the user input to DAC 104. Moreover, DAC 104 may, based on the digital signal, generate and provide a threshold voltage corresponding to the particular current load indicated by the user input to current monitor 108. Further, current monitor 108 may compare the output voltage of the sense resistor or resistor 114 against the threshold voltage and adjust the state of transistor 110 to control the current flow provided to the one or more pulsed switching electronics based on the comparison.

In other examples, and as illustrated in FIG. 1, processor 102 may be electrically coupled to resistor 114, via current monitor 108. In such examples, processor 102 may detect the voltage of the sensing component and determine the load current of the pulsed or switching electronics (e.g., driver component 112). Further, processor 102 may monitor the load current provided to the one or more pulsed or switching electronics, while current monitor 108 monitors and, in some instances, limit the electrical current flowing to the one or more pulsed or switching component without any user intervention or signals from processor 102.

Referring back to FIG. 1, circuit 100 may include an analog-digital converter (ADC) 106. In some examples, a user may monitor current flow provided to one or more pulsed or switching electronics, such as driver component 112. In such examples, current monitor 108 may provide an output voltage of resistor 114 to processor 102 through ADC 106. ADC 106 may convert the output voltage to a digital signal corresponding to the output voltage and provide the digital signal to processor 102. Processor 102 may obtain the digital signal and determine the output voltage of sense resistor or resistor 114. Additionally, processor 102 may determine current flow or load current provided to resistor 114 or the one or more pulsed or switching electronics based on a resistance of resistance 114 and the output voltage. As described herein, processor 102 may monitor the load current provided to the one or more pulsed or switching electronics, while current monitor 108 monitors the load current provided to the one or more pulsed or switching electronics. Additionally, while processor 102 monitors the load current of the pulsed or switching electronics, current monitor 108 may monitor and automatically limit the electrical current flowing to the one or more pulsed or switching component without any user intervention or signals from the processor with much lower latencies.

In some examples, the determined current flow or load current provided to resistor 114 or to the one or more pulsed or switching electronics, such as driver component 112, may be presented to a user. For instance, processor 102 may generate current data indicating the determined current flow or current load of resistor 114 or the one or more pulsed or switching electronics (e.g., driver component 112). Additionally, processor 102 may transmit, over one or more communications networks, the current data to a mobile computing device operated by the user, as described herein. A processor of the mobile computing device may generate one or more graphical representations of the current flow or current load provided to the one or more pulsed or switching electronics based on the current data. Additionally, the processor of the mobile computing device may provide the one or more graphical representations to a display of the mobile computing device. The display may render the one or more graphical representations for presentation to the user within a corresponding interface, such as a graphical user interface (GUI), by a corresponding application. In another instance, processor 102 may generate one or more graphical representations of the current flow or a current load provided to the one or more pulsed or switching electronics based on the current data. Additionally, processor 102 may provide the one or more graphical representations to a display coupled to processor 102. The display may render the one or more graphical representations for presentation to the user within a corresponding interface, such as a graphical user interface (GUI) generated by a corresponding application. As described herein, the user may monitor, in real time, the load current or current flow provided to the one or more pulsed or switching electronics (e.g., driver component 112), while current monitor 108 monitors the load current or current flow provided to the one or more pulsed or switching electronics. In examples where the current load or current flow get too high (e.g., higher than set by the user or the corresponding threshold voltage), current monitor 108 may cause the current flow to be shut off without intervention from the user monitoring the current load or current flow of the one or more switching electronics.

Figure 2A:
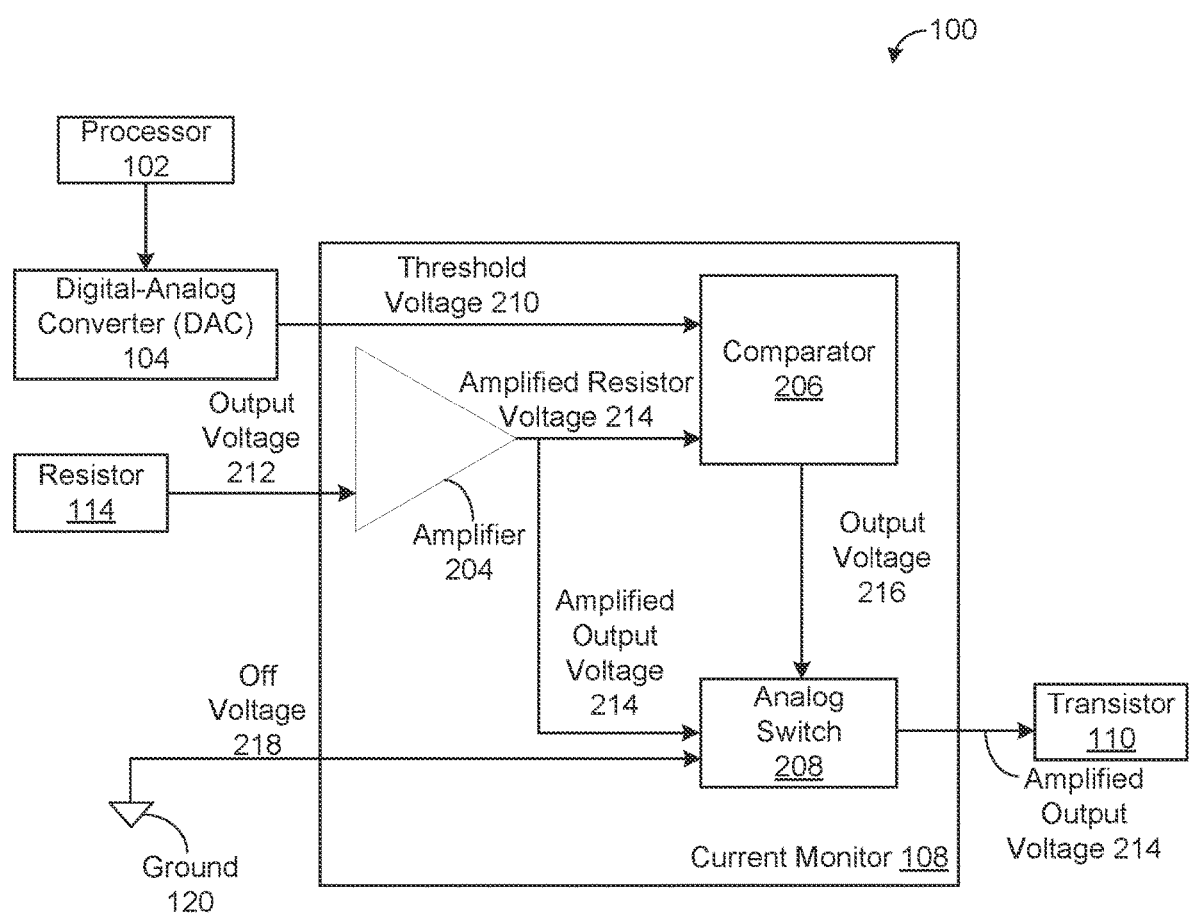
FIGS. 2A and 2B illustrate example circuit diagrams of a current monitor, according to some examples of the present disclosure.
Figure 2B:
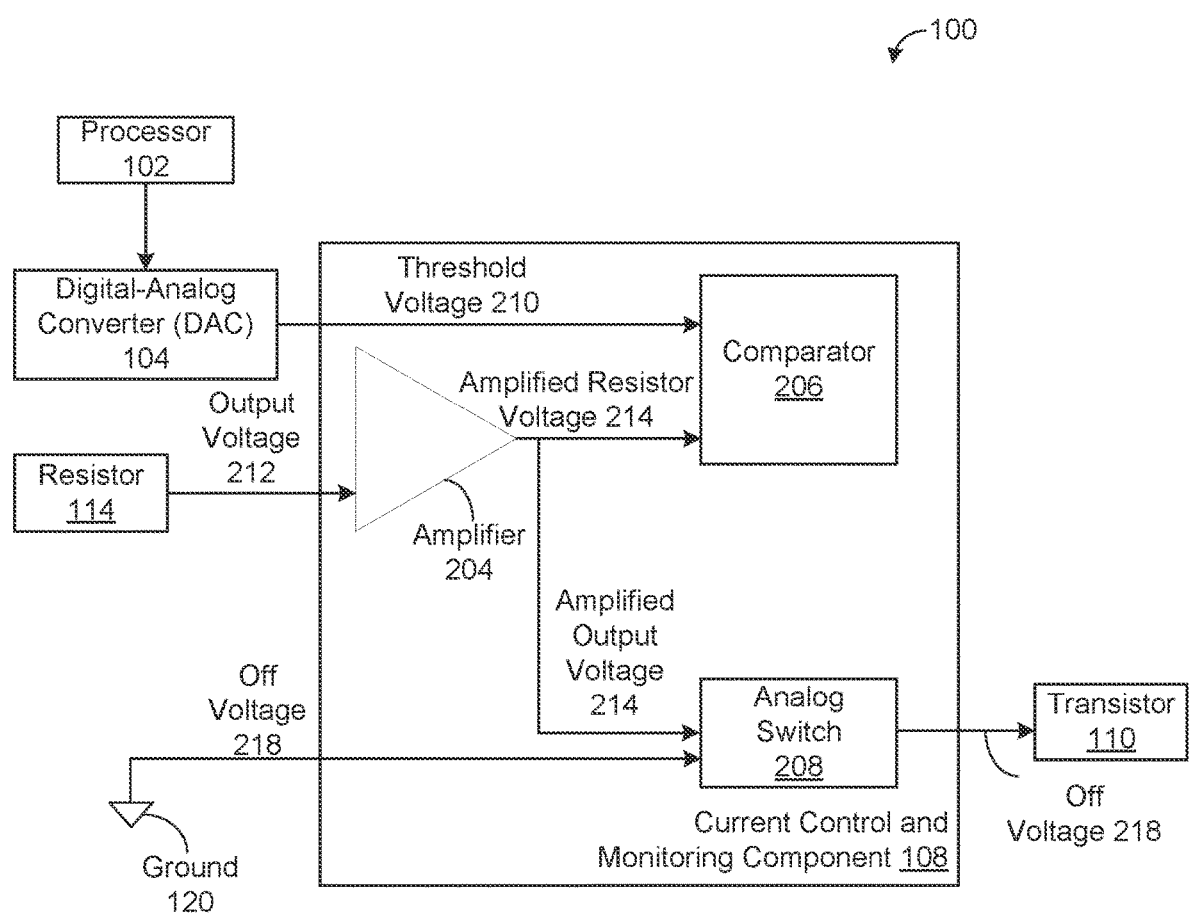

Referring to FIGS. 2A and 2B, current monitor 108 may include amplifier 204, comparator 206 and analog switch 208. As illustrated in FIGS. 2A and 2B, current monitor 108 may obtain threshold voltage 210 from processor 102 via DAC 104. As described herein, processor 102 may receive a user input from a mobile computing device operated by a user over one or more communications network or a display unit and/or an input unit coupled to processor 102. The user input may indicate a particular load current or measured current flow to adjust transistor 110 from a closed state to an opened state. Additionally, processor 102 may generate and provide a digital signal corresponding to the user input to DAC 104. Moreover, DAC 104 may, based on the digital signal, generate and provide threshold voltage 210 corresponding to the particular load current indicated by the user input to comparator 206.

Further, sense resistor or resistor 114 may provide output voltage 212 to comparator 206. In some examples, and as illustrated in FIGS. 2A and 2B, output voltage 212 of resistor 114 may not be large enough for comparator 206 to detect. In such examples, amplifier 204 included in current monitor 108 may increase the voltage level of output voltage 212 to a level that is detectable by comparator 206. For instance, amplifier 204 may receive output voltage 212 from resistor 114. Additionally, amplifier 204 may increase the voltage level of output voltage 212 to an amplified output voltage 214 and provide the amplified output voltage 214 to comparator 206. As described herein, the amplified output voltage 214 is an amplified voltage level of output voltage 212 that is detectable by comparator 206. Examples of amplifiers that amplifier 204 may be, include, but are not limited to, a voltage operational amplifier (op-amp).

Referring back to FIGS. 2A and 2B, comparator 206 may compare output voltage 212 or amplified output voltage 214 (when output voltage 212 is too low of a voltage level for comparator 206 to detect) with threshold voltage 210. Additionally, based on the comparison, comparator 206 may adjust a state of analog switch 208. As described herein, analog switch 208, such as a two-input analog switch, may be in an open state or a closed state. The state of analog switch 208 may adjust the state of transistor 110. As described herein, the state of transistor 110 may control the flow of the one or more pulsed switching electronics, such as driver component 112, as illustrated in FIG. 1.

Referring to FIG. 2A, analog switch 208 may cause transistor 110 to maintain a closed state. By way of example, during an initial power up of circuit 100, transistor 110 may be in a closed state. While circuit 100 is being powered, current flow from transistor 110 to resistor 114 (e.g., the load current of driver component 112) may start to increase. As the current flow or load current provided to resistor 114 increases, a corresponding output voltage 212 of resistor 114 and amplified output voltage 214 increases as well. Additionally, comparator 206 may continuously or periodically compare the amplified output voltage 214 to threshold voltage 210. In examples where comparator 206 determines amplified output voltage 214 is less than threshold voltage 210, comparator 206 may provide output voltage 216 to analog switch 208. Output voltage 216 may cause analog switch 208 to be in a closed state passing amplified output voltage 214 from amplifier 204 to transistor 110. Additionally, amplified output voltage 214 may cause transistor 110 to be in a closed state, thereby passing current from transistor 110 to one or more pulsed or switching electronics (e.g., driver component 112) and resistor 114.

However, as illustrated in FIG. 2B, in some examples analog switch 208 may cause transistor 110 to go from a closed state to an open state when the current flow or load current is too high. In such examples, as the load current continues to increase, the corresponding output voltage 212 and amplified output voltage 214 also increases. As the current flow or load current builds, output voltage 212 and amplified output voltage 214 increases, gets closer to threshold voltage 210. Once amplified output voltage 214 is greater than threshold voltage 210 analog switch 208 may go from a closed state to an open state. Once analog switch 208 is in the open state, analog switch 208 may pass off voltage 218 to transistor 110. As described herein, off voltage 218 may be a voltage that causes transistor 110 to be in cut off mode (e.g., transistor 110 acts like an open circuit and no current flows through transistor 11). As such, transistor 110 is in an open state, thereby shutting off or cutting off current or the flow of current from transistor 110 to the one or more pulsed or switching electronics (e.g., driver component 112) and resistor 114.

As described herein, examples of comparators that comparator 206 may be, include, but are not limited to, a dedicated comparator integrated circuit (IC) or any op-amp based implementations. In some examples, analog switch 208 may be a two-input single pole, double throw (SPDT) analog switch or multiplexer.

Figure 3:
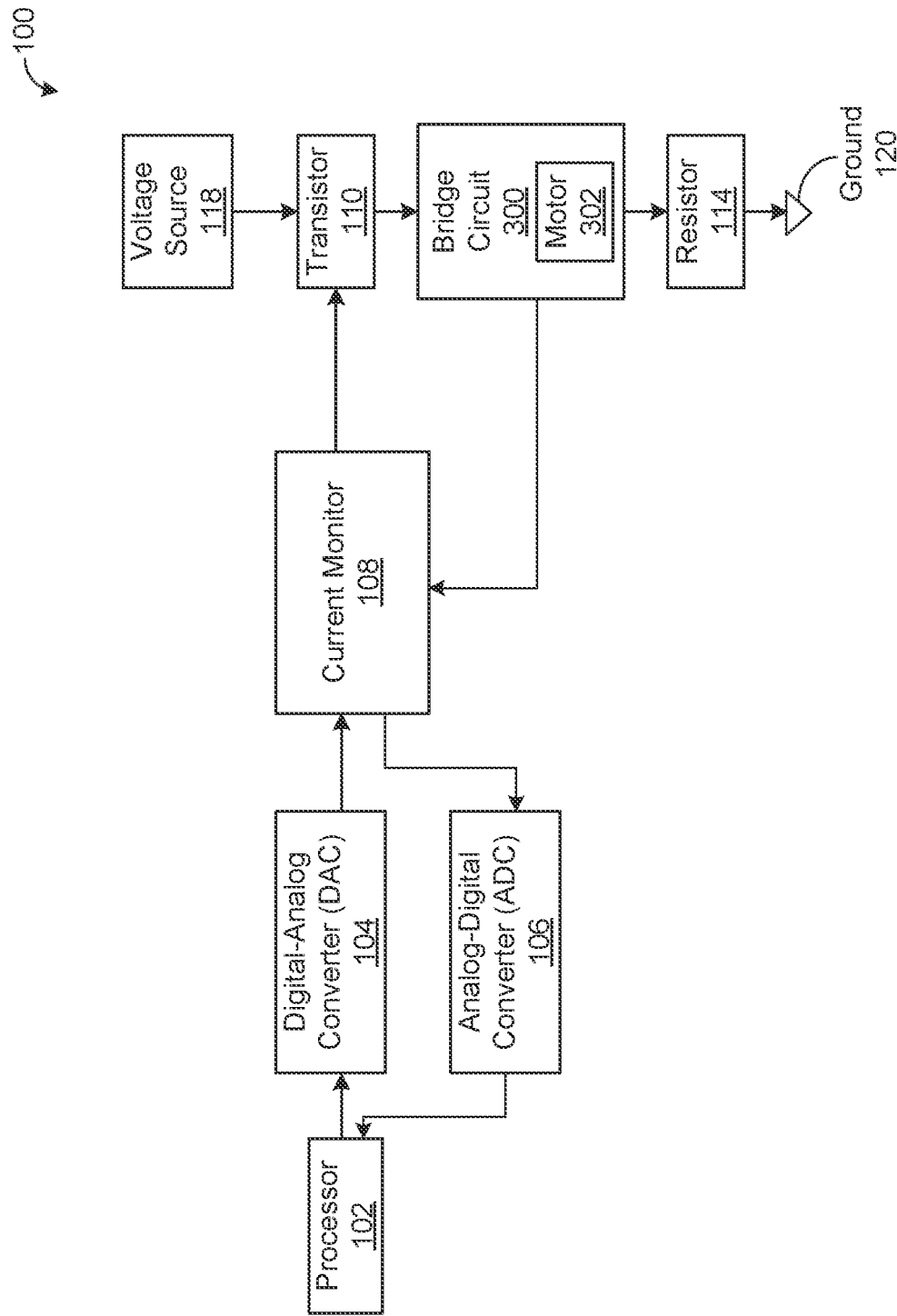
FIG. 3 illustrates an example circuit that monitors and controls current flow of a motor, according to some examples of the present disclosure.

Referring to FIG. 3, one or more pulsed or switching electronic components, such as driver component 112 of FIG. 1, may include bridge circuit 300 and motor 302. As described herein, bridge circuit 300 may drive motor 302. In some instances, bridge circuit 300 may be a full bridge circuit or a half bridge circuit. Additionally, current monitor 108 may monitor a load current provided to bridge circuit 300 and adjust the load current provided to bridge circuit 300 based on the monitored load current of bridge circuit 300.

By way of example, during an initial power up of circuit 100, transistor 110 may be in a closed state. Additionally, processor 102 may receive a user input from a mobile computing device operated by a user over one or more communications network or a display unit and/or an input unit coupled to processor 102. The user input may indicate a particular load current or measured current flow to adjust transistor 110 from a closed state to an opened state. Moreover, processor 102 may generate and provide a digital signal corresponding to the user input to DAC 104. Further, DAC 104 may, based on the digital signal, generate and provide a threshold voltage corresponding to the electrical current level indicated by the user input to current monitor 108. While circuit 100 is being powered, electrical current may flow from transistor 110, to bridge circuit 300 including motor 302, and resistor 114, and the current flow or load current provided to bridge circuit 300 may increase. As the load current increases, output voltage of resistor 114 increases as well. In examples where current monitor 108 includes a voltage amplifier, such as amplifier 204 of FIGS. 2A and 2B, output voltage of resistor 114 may be amplified. Additionally, while circuit 100 is being powered, current monitor 108 may compare the output voltage of resistor 114 or the amplified output voltage of resistor 114 to the threshold voltage. Further, and as described herein, current monitor 108 may adjust the state of transistor 110 to control the current flow provided to bridge circuit 300 including motor 302 (e.g., the one or more pulsed switching electronics) based on the comparison.

For instance, current monitor 108 may determine the threshold voltage is greater than the output voltage of resistor 114 or the amplified output voltage of resistor 114. In such instance, current monitor 108 may continue to pass the output voltage of resistor 114 or the amplified output voltage of resistor 114 to transistor 110. As such, transistor 110 may continue to be in a closed state and continue to allow current to flow from transistor 110 to bridge circuit 300 including motor 302, and resistor 114. In another instance, current monitor 108 may determine the threshold voltage is less than or equal to the output voltage of resistor 114 or the amplified output voltage of resistor 114. In such an instance, current monitor 108 may no longer pass the output voltage of resistor 114 or the amplified output voltage of resistor 114 to transistor 110 and causes off voltage 218 to pass to transistor 110. As such, transistor 110 may be in an opened state and shut off or cut off the current flow from transistor 110 to bridge circuit 300 including motor 302, and resistor 114.

Figure 4:
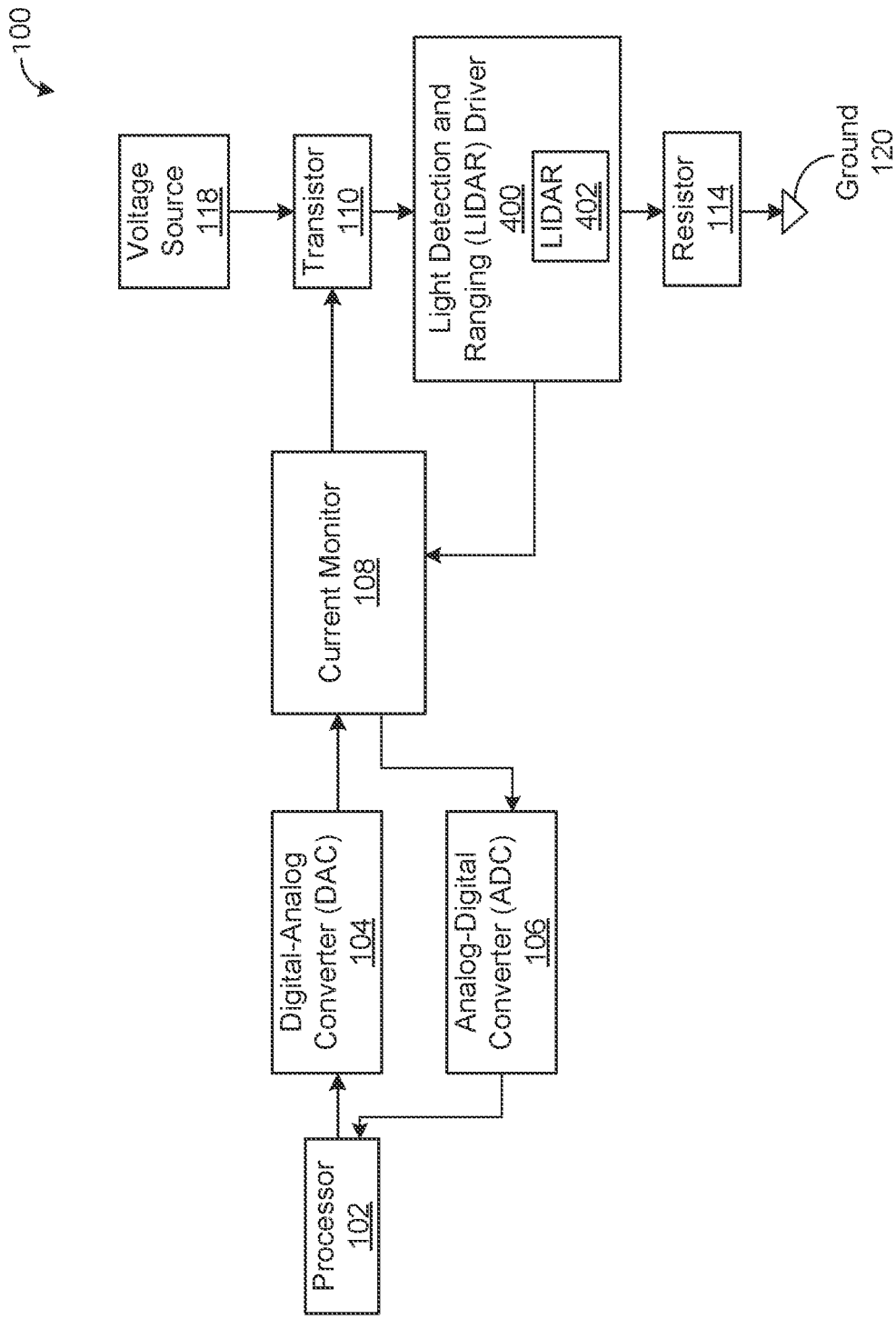
FIG. 4 illustrates an example circuit that monitors and controls current flow to a light detection and ranging (LIDAR) sensor, according to some examples of the present disclosure.

Referring to FIG. 4, one or more pulsed or switching electronic components, such as drive component 112 of FIG. 1, may include LIDAR driver 400 and LIDAR sensor 402. As described herein, LIDAR driver 400 may drive LIDAR sensor 402. In some instances, LIDAR driver 400 may be a laser diode and a transistor electrically coupled in series. In other instances, LIDAR driver 400 may include a mechanical load/machine actuated with coils or solenoids. Additionally, current monitor 108 may monitor a load current provided to LIDAR driver 400 and adjust the load current provided to LIDAR driver 400 based on the monitored load current of LIDAR driver 400.

By way of example, during an initial power up of circuit 100, transistor 110 may be in a closed state. Additionally, processor 102 may receive a user input from a mobile computing device operated by a user over one or more communications network or a display unit and/or an input unit coupled to processor 102. The user input may indicate a particular load current or measured current flow to adjust transistor 110 from a closed state to an opened state. Moreover, processor 102 may generate and provide a digital signal corresponding to the user input to DAC 104. Further, DAC 104 may, based on the digital signal, generate and provide a threshold voltage corresponding to the electrical current level indicated by the user input to current monitor 108. While circuit 100 is being powered, current may flow from transistor 110, to LIDAR driver 400 including LIDAR sensor 402, and resistor 114, and the current flow or load current of LIDAR driver 400 and LIDAR sensor 402 may increase. As the load current increases, output voltage of resistor 114 increases as well. In examples where current monitor 108 includes a voltage amplifier, such as amplifier 204 of FIGS. 2A and 2B, output voltage of resistor 114 may be amplified. Additionally, while circuit 100 is being powered, current monitor 108 may compare the output voltage of resistor 114 or the amplified output voltage of resistor 114 to the threshold voltage. Further, and as described herein, current monitor 108 may adjust the state of transistor 110 to control the current flow provided to LIDAR driver 400 and LIDAR sensor 402 (e.g., the one or more pulsed switching electronics) based on the comparison.

For instance, current monitor 108 may determine the threshold voltage is greater than the output voltage of resistor 114 or the amplified output voltage of resistor 114. In such instance, current monitor 108 may continue to pass the output voltage of resistor 114 or the amplified output voltage of resistor 114 to transistor 110. As such, transistor 110 may continue to be in a closed state and continue to allow current to flow from transistor 110 to LIDAR driver 400 including LIDAR sensor 402, and resistor 114. In another instance, current monitor 108 may determine the threshold voltage is less than or equal to the output voltage of resistor 114 or the amplified output voltage of resistor 114. In such instance, current monitor 108 may no longer pass the output voltage of resistor 114 or the amplified output voltage of resistor 114 to transistor 110 and instead causes off voltage 218 to pass to transistor 110. As such, transistor 110 may be in an opened state and shut off or cut off electrical current from transistor 110 to LIDAR driver 400, including LIDAR sensor 402, and resistor 114.

Figure 5:
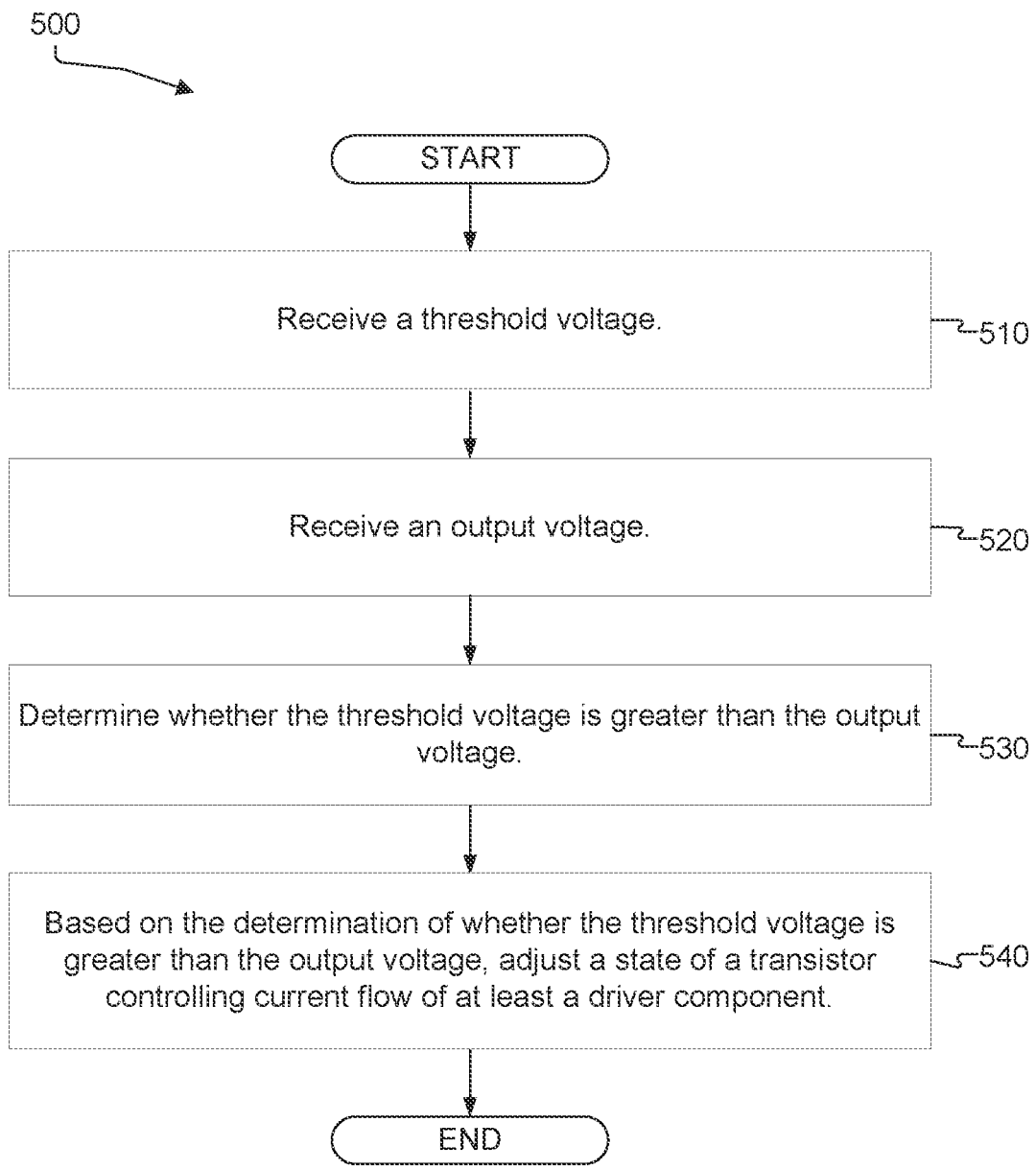
FIG. 5 illustrates an example flowchart of exemplary processes for monitoring and controlling current flow provided to one or more pulsed or switching electronics.

FIG. 5 is a flow chart of an exemplary process 500 for monitoring and controlling current flow provided to one or more pulsed or switching electronics. In some instances, one or more components of circuit 100 may perform all or a portion of the steps of exemplary process 500, which include but are not limited to receiving a threshold voltage, receiving an output voltage, determining whether the threshold voltage is greater than the output voltage, and based on the determination of whether the threshold voltage is greater than the output voltage, adjust a state of a transistor controlling current flow of at least a driver component of one or more pulsed or switching electronics.

Referring to FIG. 5, current monitor 108 of circuit 100, may receive a threshold voltage (e.g., in step 510). Additionally, current monitor 108 may receive the threshold voltage from processor 102 via DAC 104. As described herein, processor 102 may receive a user input from a mobile computing device operated by a user over one or more communications network or a display unit and/or an input unit coupled to processor 102. The user input may indicate a particular load current or measured current flow to adjust transistor 110 from a closed state to an opened state. Moreover, processor 102 may generate and provide a digital signal corresponding to the user input to DAC 104. Further, DAC 104 may, based on the digital signal, generate and provide a threshold voltage corresponding to the electrical current level indicated by the user input to current monitor 108.

Referring back to FIG. 5, current monitor 108 of circuit 100, may receive an output voltage (e.g., in step 520). Additionally, current monitor 108 may receive output voltage from sense resistor or resistor 114. As described herein, sense resistor or resistor 114 may be coupled to one or more pulsed or switching electronic components (e.g., driver component 112) or placed in the current flow path of the one or more pulsed or switching electronic components.

Referring back to FIG. 5, current monitor 108 of circuit 100, may determine whether the threshold voltage is greater than the output voltage (e.g., in step 530). Additionally, current monitor 108 of circuit 100, may, based on the determination of whether the threshold voltage is greater than the output voltage, adjust a state of a transistor controlling current flow of at least a driver component of one or more pulsed or switching electronics (e.g., in step 540). In some examples, current monitor 108 may include a voltage amplifier, such as amplifier 204 of FIGS. 2A and 2B. In such examples, current monitor 108 may amplify the voltage levels of the output voltage and compare the amplified output voltage to the threshold voltage.

By way of example, the one or more pulsed or switching electronics may include bridge circuit 300 and motor 302. Additionally, current monitor 108 may determine the threshold voltage is greater than the output voltage of resistor 114 or the amplified output voltage of resistor 114. Further, current monitor 108 may continue to pass the output voltage of resistor 114 or the amplified output voltage of resistor 114 to transistor 110. As such, transistor 110 may continue to be in a closed state and continue to allow current to flow from transistor 110 to bridge circuit 300 including motor 302, and resistor 114.

Alternatively, current monitor 108 may determine the threshold voltage is less than or equal to the output voltage of resistor 114 or the amplified output voltage of resistor 114. In such example, current monitor 108 may no longer pass the output voltage of resistor 114 or the amplified output voltage of resistor 114 to transistor 110 and instead causes an off voltage to be passed to transistor 110. As such, transistor 110 may be in an opened state and shut off or cut off electrical current from transistor 110 to bridge circuit 300 including motor 302, and resistor 114.

Figure 6:
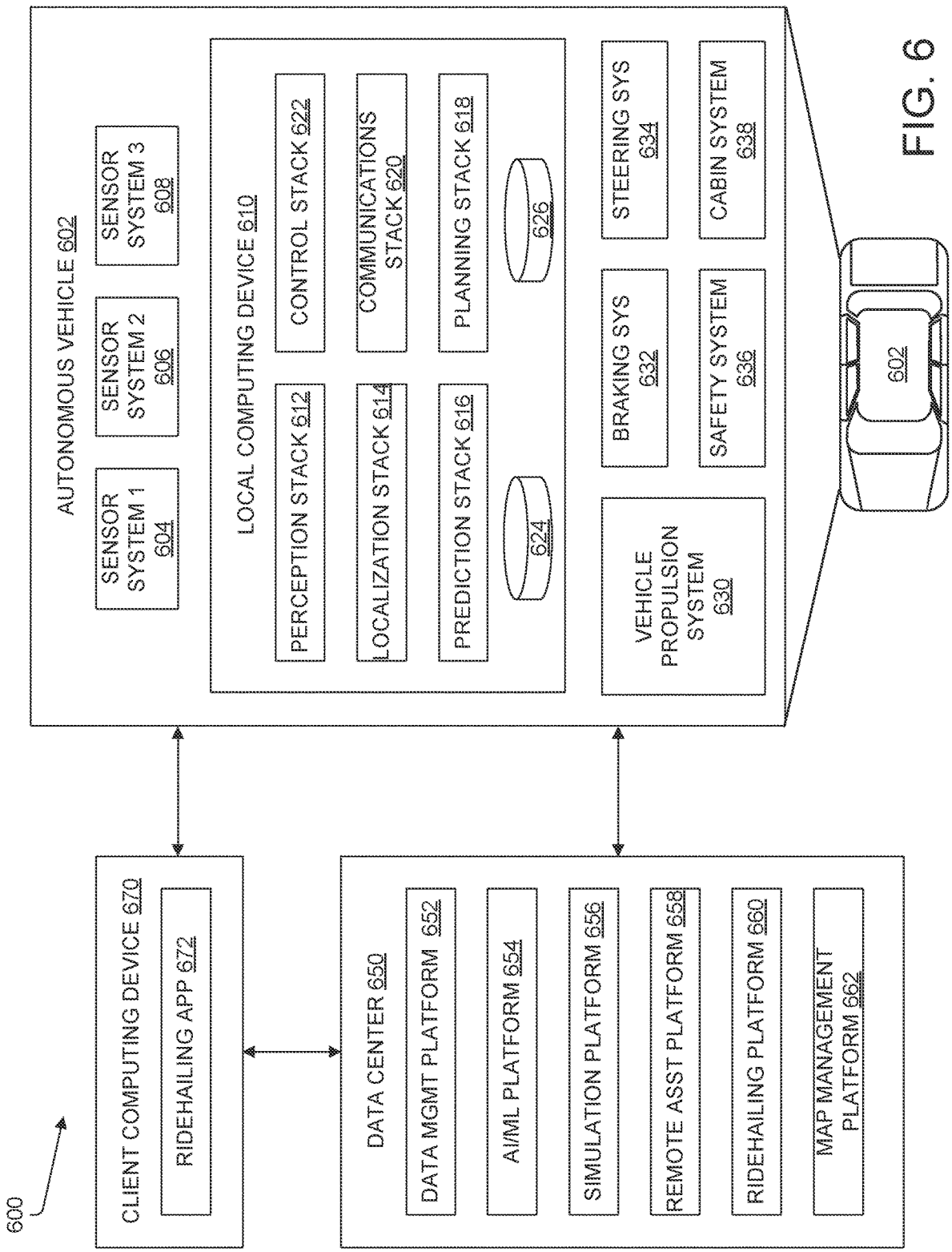
FIG. 6 illustrates an example system environment that can be used to facilitate autonomous vehicle (AV) dispatch and operations, according to some aspects of the disclosed technology.

FIG. 6 is a diagram illustrating an example autonomous vehicle (AV) environment 600, according to some examples of the present disclosure. One of ordinary skill in the art will understand that, for AV environment 600 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skills, the art will appreciate that such variations do not depart from the scope of the present disclosure. As described herein, AV environment 600 may include one or more components of circuit 100, such current monitor 108, to control a load current or current flow provided to one or more voltage driven pulsed or switching electronic components, such as one or more sensors (e.g., a LIDAR sensor 402 of FIG. 4) of sensor system 604, sensor system 606, and/or sensor system 608, and/or one or more components of vehicle propulsion system 630 (e.g., an electric motor, such as motor 302 of FIG. 3).

In this example, the AV environment 6600 includes an AV 602, a data center 650, and a client computing device 670. The AV 602, the data center 650, and the client computing device 670 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 602 can navigate roadways without a human driver based on sensor signals generated by multiple sensor systems 604, 606, and 608. The sensor systems 604-608 can include one or more types of sensors and can be arranged about the AV 602. For instance, the sensor systems 604-608 can include Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 604 can be a camera system, the sensor system 606 can be a LIDAR system, and the sensor system 608 can be a RADAR system. Other examples may include any other number and type of sensors.

The AV 602 can also include several mechanical systems that can be used to maneuver or operate the AV 602. For instance, the mechanical systems can include a vehicle propulsion system 630, a braking system 632, a steering system 634, a safety system 636, and a cabin system 638, among other systems. The vehicle propulsion system 630 can include an electric motor, an internal combustion engine, or both. The braking system 632 can include an engine brake, brake pads, actuators, and/or any other suitable componentry configured to assist in decelerating the AV 602. The steering system 634 can include suitable componentry configured to control the direction of movement of the AV 602 during navigation. The safety system 636 can include lights and signal indicators, a parking brake, airbags, and so forth. The cabin system 638 can include cabin temperature control systems, in-cabin entertainment systems, and so forth. In some examples, the AV 602 might not include human driver actuators (e.g., steering wheel, handbrake, foot brake pedal, foot accelerator pedal, turn signal lever, window wipers, etc.) for controlling the AV 602. Instead, the cabin system 638 can include one or more client interfaces (e.g., Graphical User Interfaces (GUIs), Voice User Interfaces (VUIs), etc.) for controlling certain aspects of the mechanical systems 630-638.

The AV 602 can include a local computing device 610 that is in communication with the sensor systems 604-608, the mechanical systems 630-638, the data center 650, and the client computing device 670, among other systems. The local computing device 610 can include one or more processors and memory, including instructions that can be executed by the one or more processors. The instructions can make up one or more software stacks or components responsible for controlling the AV 602; communicating with the data center 650, the client computing device 670, and other systems; receiving inputs from riders, passengers, and other entities within the AV's environment; logging metrics collected by the sensor systems 604-608; and so forth. In this example, the local computing device 610 includes a perception stack 612, a localization stack 614, a prediction stack 616, a planning stack 618, a communications stack 620, a control stack 622, an AV operational database 624, and an HD geospatial database 626, among other stacks and systems.

Perception stack 612 can enable the AV 602 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 604-608, the localization stack 614, the HD geospatial database 626, other components of the AV, and other data sources (e.g., the data center 650, the client computing device 670, third party data sources, etc.). The perception stack 612 can detect and classify objects and determine their current locations, speeds, directions, and the like. In addition, the perception stack 612 can determine the free space around the AV 602 (e.g., to maintain a safe distance from other objects, change lanes, park the AV, etc.). The perception stack 612 can identify environmental uncertainties, such as where to look for moving objects, flag areas that may be obscured or blocked from view, and so forth. In some examples, an output of the perception stack 612 can be a bounding area around a perceived object that can be associated with a semantic label that identifies the type of object that is within the bounding area, the kinematic of the object (information about its movement), a tracked path of the object, and a description of the pose of the object (its orientation or heading, etc.).

Localization stack 614 can determine the AV's position and orientation (pose) using different methods from multiple systems (e.g., GPS, IMUs, cameras, LIDAR, RADAR, ultrasonic sensors, the HD geospatial database 626, etc.). For example, in some cases, the AV 602 can compare sensor data captured in real-time by the sensor systems 604-608 to data in the HD geospatial database 626 to determine its precise (e.g., accurate to the order of a few centimeters or less) position and orientation. The AV 602 can focus its search based on sensor data from one or more first sensor systems (e.g., GPS) by matching sensor data from one or more second sensor systems (e.g., LIDAR). If the mapping and localization information from one system is unavailable, the AV 602 can use mapping and localization information from a redundant system and/or from remote data sources.

Prediction stack 616 can receive information from the localization stack 614 and objects identified by the perception stack 612 and predict a future path for the objects. In some examples, the prediction stack 616 can output several likely paths that an object is predicted to take along with a probability associated with each path. For each predicted path, the prediction stack 616 can also output a range of points along the path corresponding to a predicted location of the object along the path at future time intervals along with an expected error value for each of the points that indicates a probabilistic deviation from that point.

Planning stack 618 can determine how to maneuver or operate the AV 602 safely and efficiently in its environment. For example, the planning stack 618 can receive the location, speed, and direction of the AV 602, geospatial data, data regarding objects sharing the road with the AV 602 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 602 from one point to another and outputs from the perception stack 612, localization stack 614, and prediction stack 616. The planning stack 618 can determine multiple sets of one or more mechanical operations that the AV 602 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 618 can select from multiple backup plans to carry out. For example, while preparing to change lanes to turn right at an intersection, another vehicle may aggressively cut into the destination lane, making the lane change unsafe. The planning stack 618 could have already determined an alternative plan for such an event. Upon its occurrence, it could help direct the AV 602 to go around the block instead of blocking a current lane while waiting for an opening to change lanes.

Control stack 622 can manage the operation of the vehicle propulsion system 630, the braking system 632, the steering system 634, the safety system 636, and the cabin system 638. The control stack 622 can receive sensor signals from the sensor systems 604-608 as well as communicate with other stacks or components of the local computing device 610 or a remote system (e.g., the data center 650) to effectuate operation of the AV 602. For example, the control stack 622 can implement the final path or actions from the multiple paths or actions provided by the planning stack 618. This can involve turning the routes and decisions from the planning stack 618 into commands for the actuators that control the AV's steering, throttle, brake, and drive unit.

Communications stack 620 can transmit and receive signals between the various stacks and other components of the AV 602 and between the AV 602, the data center 650, the client computing device 670, and other remote systems. The communications stack 620 can enable the local computing device 610 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). Communications stack 620 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Low Power Wide Area Network (LPWAN), Bluetooth®, infrared, etc.).

The HD geospatial database 626 can store HD maps and related data of the streets upon which the AV 602 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

AV operational database 624 can store raw AV data generated by the sensor systems 604-608, stacks 612-622, and other components of the AV 602 and/or data received by the AV 602 from remote systems (e.g., the data center 650, the client computing device 670, etc.). In some examples, the raw AV data can include HD LIDAR point cloud data, image data, RADAR data, GPS data, and other sensor data that the data center 650 can use for creating or updating AV geospatial data or for creating simulations of situations encountered by AV 602 for future testing or training of various machine learning algorithms that are incorporated in the local computing device 610.

Data center 650 can include a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and/or any other network. The data center 650 can include one or more computing devices remote to the local computing device 610 for managing a fleet of AVs and AV-related services. For example, in addition to managing the AV 602, the data center 650 may also support a ride-hailing service (e.g., a ridesharing service), a delivery service, a remote/roadside assistance service, street services (e.g., street mapping, street patrol, street cleaning, street metering, parking reservation, etc.), and the like.

Data center 650 can send and receive various signals to and from the AV 602 and the client computing device 670. These signals can include sensor data captured by the sensor systems 604-608, roadside assistance requests, software updates, ride-hailing/ridesharing pick-up and drop-off instructions, and so forth. In this example, the data center 650 includes a data management platform 652, an Artificial Intelligence/Machine Learning (AI/ML) platform 654, a simulation platform 656, a remote assistance platform 658, and a ride-hailing platform 660, and a map management platform 662, among other systems.

Data management platform 652 can be a "big data" system capable of receiving and transmitting data at high velocities (e.g., near real-time or real-time), processing a large variety of data and storing large volumes of data (e.g., terabytes, petabytes, or more of data). The varieties of data can include data having different structures (e.g., structured, semi-structured, unstructured, etc.), data of different types (e.g., sensor data, mechanical system data, ride-hailing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), and/or data having other characteristics. The various platforms and systems of the data center 650 can access data stored by the data management platform 652 to provide their respective services.

The AI/ML platform 654 can provide the infrastructure for training and evaluating machine learning algorithms for operating the AV 602, the simulation platform 656, the remote assistance platform 658, the ride-hailing platform 660, the map management platform 662, and other platforms and systems. Using the AI/ML platform 654, data scientists can prepare data sets from the data management platform 652; select, design, and train machine learning models; evaluate, refine, and deploy the models; maintain, monitor, and retrain the models; and so on.

Simulation platform 656 can enable testing and validation of the algorithms, machine learning models, neural networks, and other development efforts for the AV 602, the remote assistance platform 658, the ride-hailing platform 660, the map management platform 662, and other platforms and systems. Simulation platform 656 can replicate a variety of driving environments and/or reproduce real-world scenarios from data captured by the AV 602, including rendering geospatial information and road infrastructure (e.g., streets, lanes, crosswalks, traffic lights, stop signs, etc.) obtained from a cartography platform (e.g., map management platform 662); modeling the behavior of other vehicles, bicycles, pedestrians, and other dynamic elements; simulating inclement weather conditions, different traffic scenarios; and so on.

Remote assistance platform 658 can generate and transmit instructions regarding the operation of the AV 602. For example, in response to an output of the AI/ML platform 654 or other system of the data center 650, the remote assistance platform 658 can prepare instructions for one or more stacks or other components of the AV 602.

Ride-hailing platform 660 can interact with a customer of a ride-hailing service via a ride-hailing application 672 executing on the client computing device 670. The client computing device 670 can be any type of computing system such as, for example and without limitation, a server, desktop computer, laptop computer, tablet computer, smartphone, smart wearable device (e.g., smartwatch, smart eyeglasses or other Head-Mounted Display (HMD), smart ear pods, or other smart in-ear, on-ear, or over-ear device, etc.), gaming system, or any other computing device for accessing the ride-hailing application 672. The client computing device 670 can be a customer's mobile computing device or a computing device integrated with the AV 602 (e.g., the local computing device 610). The ride-hailing platform 660 can receive requests to pick up or drop off from the ride-hailing application 672 and dispatch the AV 602 for the trip.

Map management platform 662 can provide a set of tools for the manipulation and management of geographic and spatial (geospatial) and related attribute data. The data management platform 652 can receive LIDAR point cloud data, image data (e.g., still image, video, etc.), RADAR data, GPS data, and other sensor data (e.g., raw data) from one or more AVs 602, Unmanned Aerial Vehicles (UAVs), satellites, third-party mapping services, and other sources of geospatially referenced data. The raw data can be processed, and map management platform 662 can render base representations (e.g., tiles (2D), bounding volumes (3D), etc.) of the AV geospatial data to enable users to view, query, label, edit, and otherwise interact with the data. Map management platform 662 can manage workflows and tasks for operating on the AV geospatial data. Map management platform 662 can control access to the AV geospatial data, including granting or limiting access to the AV geospatial data based on user-based, role-based, group-based, task-based, and other attribute-based access control mechanisms. Map management platform 662 can provide version control for the AV geospatial data, such as to track specific changes that (human or machine) map editors have made to the data and to revert changes when necessary. Map management platform 662 can administer release management of the AV geospatial data, including distributing suitable iterations of the data to different users, computing devices, AVs, and other consumers of HD maps. Map management platform 662 can provide analytics regarding the AV geospatial data and related data, such as to generate insights relating to the throughput and quality of mapping tasks.

In some embodiments, the map viewing services of map management platform 662 can be modularized and deployed as part of one or more of the platforms and systems of the data center 650. For example, the AI/ML platform 654 may incorporate the map viewing services for visualizing the effectiveness of various object detection or object classification models, the simulation platform 656 may incorporate the map viewing services for recreating and visualizing certain driving scenarios, the remote assistance platform 658 may incorporate the map viewing services for replaying traffic incidents to facilitate and coordinate aid, the ride-hailing platform 660 may incorporate the map viewing services into the client application 672 to enable passengers to view the AV 602 in transit enroute to a pick-up or drop-off location, and so on.

While the autonomous vehicle 602, the local computing device 610, and the autonomous vehicle environment 600 are shown to include certain systems and components, one of ordinary skill will appreciate that the autonomous vehicle 602, the local computing device 610, and/or the autonomous vehicle environment 600 can include more or fewer systems and/or components than those shown in FIG. 6. For example, the autonomous vehicle 602 can include other services than those shown in FIG. 6 and the local computing device 610 can also include, in some instances, one or more memory devices (e.g., RAM, ROM, cache, and/or the like), one or more network interfaces (e.g., wired and/or wireless communications interfaces and the like), and/or other hardware or processing devices that are not shown in FIG. 6. An illustrative example of a computing device and hardware components that can be implemented with the local computing device 610 is described below with respect to FIG. 7

Figure 7:
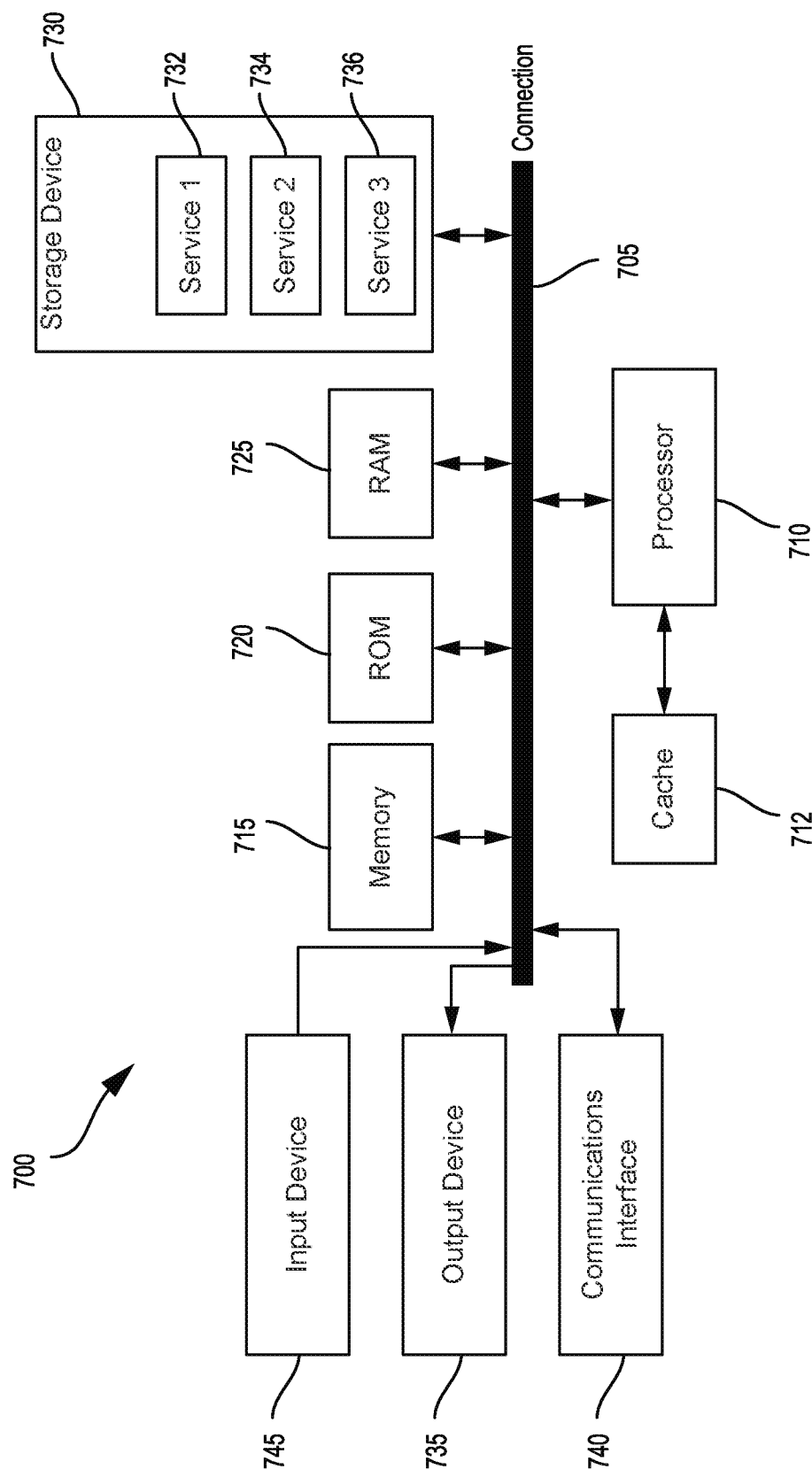
FIG. 7 illustrates an example processor-based system with which some aspects of the subject technology can be implemented.

FIG. 7 illustrates an example processor-based system with which some aspects of the subject technology can be implemented. For example, processor-based system 700 can be any computing device making up, or any component thereof in which the components of the system are in communication with each other using connection 705. Connection 705 can be a physical connection via a bus, or a direct connection into processor 710, such as in a chipset architecture. Connection 705 can also be a virtual connection, networked connection, or logical connection.

In some embodiments, computing system 700 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 700 includes at least one processing unit (Central Processing Unit (CPU) or processor) 710 and connection 705 that couples various system components including system memory 715, such as Read-Only Memory (ROM) 720 and Random-Access Memory (RAM) 725 to processor 710. Computing system 700 can include a cache of high-speed memory 712 connected directly with, in close proximity to, or integrated as part of processor 710.

Processor 710 can include any general-purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. The communication interface may perform or facilitate receipt and/or transmission wired or wireless communications via wired and/or wireless transceivers, including those making use of an audio jack/ plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communications interface 740 may also include one or more Global Navigation Satellite System (GNSS) receivers or transceivers that are used to determine a location of the computing system 700 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 730 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L#), Resistive RAM (RRAM/ReRAM), Phase Change Memory (PCM), Spin Transfer Torque RAM (STT-RAM), another memory chip or cartridge, and/or a combination thereof.

Storage device 730 can include software services, servers, services, etc., that when the code that defines such software is executed by the processor 710, it causes the system 700 to perform a function. In some embodiments, a hardware service that performs a particular function can include the software component stored in a computer-readable medium in connection with the necessary hardware components, such as processor 710, connection 705, output device 735, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative examples of the disclosure include:

Aspect 1: An apparatus comprising: a transistor electrically coupled to a power supply, the transistor being configured to control current flow to a driver component; a resistor electrically coupled to the driver component; and a current monitor electrically coupled to a gate of the transistor and the resistor, the current monitor is configured to: receive, via a processor, a threshold voltage; receive, via the resistor, an output voltage; determine, whether the threshold voltage is greater than the output voltage; and based on the determination of whether the threshold voltage is greater than the output voltage, adjust the transistor to control the current flow to the driver component.

Aspect 2. The apparatus of Aspect 1, wherein the current monitor includes a voltage amplifier component, a comparator component, and an analog switch.

Aspect 3. The apparatus of Aspects 1 or 2, wherein the current monitor is further configured to provide the output voltage to the processor via an analog-digital converter (ADC), and wherein the processor is further configured to determine a load current associated with the resistor.

Aspect 4. The apparatus of Aspects 1 to 3, wherein the current monitor determines the threshold voltage is greater than the output voltage and adjusts the transistor to shut off the current flow to the driver component.

Aspect 5. The apparatus of Aspects 1 to 4, wherein the driver component comprises a bridge circuit.

Aspect 6. The apparatus of Aspects 1 to 5, wherein the driver component is electrically coupled to a motor via the resistor.

Aspect 7. The apparatus of Aspects 1 to 6, wherein the driver component is electrically coupled to an optical illuminator via the resistor.

Aspect 8. The apparatus of Aspects 1 to 7, further comprising: a pulsed electronic sensor electrically coupled to the resistor.

Aspect 9: A method comprising: receiving, via a processor and by a current monitor, a threshold voltage; receiving, via a resistor and by the current monitor, an output voltage, the resistor being electrically coupled to a driver component; determine, by the current monitor, whether the threshold voltage is greater than the output voltage; and based on the determination of whether the threshold voltage is greater than the output voltage, adjust, by the current monitor, a transistor to control current flow to the driver component.

Aspect 10. The method of Aspect 9, wherein the current monitor includes a voltage amplifier component, a comparator component, and an analog switch.

Aspect 11. The method of Aspects 9 or 10, further comprising: providing, by the current monitor and to the processor via an analog-digital converter (ADC), the output voltage; and wherein the processor is further configured to determine a load current associated with the resistor.

Aspect 12. The method of Aspects 9 to 11, further comprising: determining, by the current monitor, the threshold voltage is greater than the output voltage; and adjusting the transistor to shut off the current flow to the driver component.

Aspect 13. The method of Aspects 9 to 12, wherein the driver component comprises a bridge circuit.

Aspect 14. The method of Aspects 9 to 13, wherein the driver component is electrically coupled to a motor via the resistor.

Aspect 15. The method of Aspects 9 to 14, wherein the driver component is electrically coupled to an optical illuminator via the resistor.

Aspect 16. The method of Aspects 9 to 15, further comprising: a pulsed electronic sensor electrically coupled to the resistor.

Aspect 17: A system comprising: a current control component electrically coupled to a power supply, the current control component being configured to control current flow to a driver component; a sensing component electrically coupled to the driver component; and a current monitor electrically coupled to a gate of the current control component and the sensing component, the current monitor is configured to: receive, via a processor, a threshold voltage; receive, via the sensing component, an output voltage; determine, whether the threshold voltage is greater than the output voltage; and based on the determination of whether the threshold voltage is greater than the output voltage, adjust the current control component to control the current flow to the driver component.

Aspect 18. The system of Aspect 17, wherein the current monitor includes a voltage amplifier component, a comparator component, and an analog switch.

Aspect 19. The system of Aspects 17 or 18, wherein the current monitor is further configured to provide the output voltage to the processor via an analog-digital converter (ADC), and wherein the processor is further configured to determine a load current associated with the sensing component.

Aspect 20. The system of Aspects 17 to 19, wherein the current monitor determines the threshold voltage is greater than the output voltage and adjusts the current control component to shut off the current flow to the driver component.

What is claimed is:

1. An apparatus comprising:
  a transistor electrically coupled to a power supply, the transistor being configured to control current flow to a driver component;
  a resistor electrically coupled to the driver component; and
  a current monitor electrically coupled to a gate of the transistor and the resistor, the current monitor is configured to:
    receive, via a processor, a threshold voltage;
    receive, via the resistor, an output voltage;
    determine whether the threshold voltage is greater than the output voltage; and
    based on the determination of whether the threshold voltage is greater than the output voltage, adjust the transistor to control the current flow to the driver component;
    wherein the current monitor includes a voltage amplifier component, a comparator component, and an analog switch.

2. The apparatus of claim 1, wherein the current monitor is further configured to provide the output voltage to the processor via an analog-digital converter (ADC), and wherein the processor is further configured to determine a load current associated with the resistor.

3. The apparatus of claim 1, wherein the current monitor determines the threshold voltage is greater than the output voltage and adjusts the transistor to shut off the current flow to the driver component.

4. The apparatus of claim 1, wherein the driver component comprises a bridge circuit.

5. The apparatus of claim 1, wherein the driver component is electrically coupled to a motor via the resistor.

6. The apparatus of claim 1, wherein the driver component is electrically coupled to an optical illuminator via the resistor.

7. The apparatus of claim 1, further comprising:
a pulsed electronic sensor electrically coupled to the resistor.

8. A method comprising:
receiving, via a processor and by a current monitor, a threshold voltage, wherein the current monitor includes a voltage amplifier component, a comparator component, and an analog switch;
receiving, via a resistor and by the current monitor, an output voltage, the resistor being electrically coupled to a driver component;
determine, by the current monitor, whether the threshold voltage is greater than the output voltage; and
based on the determination of whether the threshold voltage is greater than the output voltage, adjust, by the current monitor, a transistor to control current flow to the driver component.

9. The method of claim 8 further comprising:
providing, by the current monitor and to the processor via an analog-digital converter (ADC), the output voltage; and
wherein the processor is further configured to determine a load current associated with the resistor.

10. The method of claim 8 further comprising:
determining, by the current monitor, the threshold voltage is greater than the output voltage; and
adjusting the transistor to shut off the current flow to the driver component.

11. The method of claim 8, wherein the driver component comprises a bridge circuit.

12. The method of claim 8, wherein the driver component is electrically coupled to a motor via the resistor.

13. The method of claim 8, wherein the driver component is electrically coupled to an optical illuminator via the resistor.

14. The method of claim 8, wherein a pulsed electronic sensor is electrically coupled to the resistor.

15. A system comprising:
a current control component electrically coupled to a power supply, the current control component being configured to control current flow to a driver component;
a sensing component electrically coupled to the driver component; and
a current monitor electrically coupled to a gate of the current control component and the sensing component, the current monitor is configured to:
receive, via a processor, a threshold voltage;
receive, via the sensing component, an output voltage;
determine whether the threshold voltage is greater than the output voltage; and based on the determination of whether the threshold voltage is greater than the output voltage; and
adjust the current control component to control the current flow to the driver component;
wherein the current monitor includes a voltage amplifier component, a comparator component, and an analog switch.

16. The system of claim 15, wherein the current monitor is further configured to provide the output voltage to the processor via an analog-digital converter (ADC), and wherein the processor is further configured to determine a load current associated with the sensing component.

17. The system of claim 15, wherein the current monitor determines the threshold voltage is greater than the output voltage and adjusts the current control component to shut off the current flow to the driver component.

* * * * *